United States Patent [19]

Morisaki

[11] 4,049,481

[45] Sept. 20, 1977

[54] SURFACE TREATMENT METHOD OF COPPERFOIL

[75] Inventor: Shigeyoshi Morisaki, Ageo, Japan

[73] Assignee: Mitsui-Anaconda Electro Copper Sheet Co. Ltd., Tokyo, Japan

[21] Appl. No.: 696,624

[22] Filed: June 16, 1976

[30] Foreign Application Priority Data

Dec. 17, 1975 Japan .............................. 50-150365

[51] Int. Cl.$^2$ .......................... C25D 3/22; C25D 3/30
[52] U.S. Cl. ..................................... 156/151; 428/647; 428/658; 204/432; 428/209; 428/901
[58] Field of Search ................... 29/191.2, 195 P, 199; 427/96, 98-99, 118, 120; 204/432; 156/151, 309, DIG. 902; 428/209

[56] References Cited

U.S. PATENT DOCUMENTS

| | | | |
|---|---|---|---|
| 1,904,732 | 4/1933 | Haueisen et al. | 204/432 |
| 2,900,314 | 8/1959 | Saubestre | 204/432 |
| 3,314,771 | 4/1967 | Hoffmann et al. | 29/199 |
| 3,585,010 | 6/1971 | Luce et al. | 29/191.2 |
| 3,857,681 | 12/1974 | Yates et al. | 156/151 |

*Primary Examiner*—Edward G. Whitby

[57] ABSTRACT

The present invention relates to a method of treatment on the surface of copperfoil mainly used for printed circuits. More particularly, it relates to a method of electrodeposition of a binary alloy consisting of zinc and tin as a barrier layer against copper migration into an adhesive substrate during subsequent heat press lamination, while a binary alloy on copperfoil is converted to ternary alloy defusing into copper by heat press lamination resulting in a layer of Cu-Zn-Sn, ternary alloy. This layer prevents spottings on the etched surfaces and provides high resistance to hydrochloric acid, and better adhesion than hitherto used alloys.

5 Claims, No Drawings

SURFACE TREATMENT METHOD OF COPPERFOIL

BACKGROUND OF INVENTION

The present invention is applied upon the surface of nodularized copper foil which is made by means of electrodeposition.

This side of copper foil is faced to the pre-preg at lamination with or without adhesive.

The characteristic of this surface, such as nodularized profile, chemical properties and thermal history have great influence on the properties of the copper clad laminate, for instance peel strength, chemical resistance, dielectric properties, appearance after etching and so forth.

In other words, the present invention is prominently useful to improve this important boundary layer of copper clad laminate, giving better and more stable adhesion and preventing reduction of peel strength which is caused by corrosion with hydrochloric acid or etchants.

Generally, the printed circuit is made of copper clad laminate which is meant consisting of copperfoil and laminating pre-preg with or without adhesive, therefore the surface of copper foil faced upon pre-preg used to be teated by various, chemical or electrochemical process. Namely, in order to obtain and to keep good adhesion between copper foil and laminating pre-preg, the surface of the copper foil is nodularized by electrodeposition, and frequently this surface is covered with another thin layer, such as a zinc layer.

This zinc layer prevent copper from migrating into the adhesive substrate, and then prevents staining or spotting on the etched resinous substrate after subsequent acid etching.

The thickness of the barrier layer of zinc is sufficiently thin to maintain peel strength of the nodularized copper layer.

During lamination, said copper foil and pre-preg are generally piled up and heat-pressed. Consequently said barrier layer of zinc diffuses into the copper substrate during application of heat and pressure, and then the color of the layer (if glass epoxy pre-preg is used, it is visible from opposite sides of the laminate) changes to yellowish brass color, in fact, after heat press lamination, the layer is herein called a binary alloy "brass" layer.

In U.S. Pat. No. 3,585,010 barrier layers consisting of various metals and alloys are described.

In the procedure of producing printed circuit boards using said copper clad laminate, generally, laminated board is punched or drilled first, then the insides of the holes thus punched are activated by non-electrolytic deposition of copper followed by electrolytic deposition of copper in the holes.

In a second stage it is well-known to photo-etch by photo resist or silk screen printing with resist ink for pattern etching, to produce the desired circuits.

During the aforesaid activation and during pattern etching, a barrier layer of brass is also utilized and immersed in concentrated hydrochloric acid solution.

In some cases, other various electroplating processes may then follow etching step. In such event the brass barrier layer is immersed in these various corrosive solutions repeatedly. Generally speaking brass is likely to be corroded by hydrochloric acid and zinc is dissolved from the brass resulting in reduction of peel strength between the copper foil and laminate.

U.S. Pat. No. 3,585,010 also refers to a binary alloy layer of bronze which is formed by electroplating a tin layer and diffusing it into a copper surface by heat and lamination pressure.

However this binary alloy layer of bronze which is formed by heat press lamination, shows a granular structure when the first tin layer is electrodeposited to a thickness necessary to obtain a high peel strength. Such granular structure is undesirable for acid etching and results in high and unreliable reduction in the peel strength when subjected to such acid treatment.

I have studied the methods of the prior art and with a view to improving these defects from depositing a binary alloy of electrodeposited metal and copper, followed by heat pressed lamination and found a method of electrodeposition of a binary alloy of zinc and tin upon nodularized copperfoil and conversion thereof to a ternary alloy (Cu-Zn-Sn) on the surface nodularized through heat press lamination, thus providing improve resistance to hydrochloric acid at the boundary layer.

In the present invention the tin and zinc binary alloy is electrodeposited in the optimum proportions to maintain high peel strength, to prevent reducing peel strength by hydrochloric acid. The electrodeposited binary alloy is preferably composed of 97%–80% of zinc and 3–20% of tin.

These ranges should be appointed to meet to some thickness range of electrodeposition layer given.

DETAILED EXPLANATION OF INVENTION

It is an object of the present invention to treat copper foil surfaces to provide good adhesion to a resinous laminate without reduction of peel strength caused by acid solution treatment. Another object of the present invention is to prevent copper migration into the adhesive or laminate which causes stains and spottings on etched boards resulting in unacceptable appearance and undesirable electric properties of printed circuit board.

I have found that a method for producing a ternary alloy containing copper, zinc and tin from electrodeposited zinc and tin on the surface of nodularized copperfoil has unexpected advantages when it used as a layer between the copperfoil and resinous laminate thereby preventing reduction of peel strength when subjected to acid treatment or etching and also minimizing the formation of stains and spottings by preventing copper migration into the adhesive and/or laminate on the etched board surface of a printed circuit. I have found that a ternary alloy of Zn-Sn-Cu exhibits eye resistance to acid solutions which has not heretofore been obtained by using a brass or bronze layer. Moreover, finely diffused zinc in the ternary alloy layer remains without dissolution from the barrier layer during acid treatment. This is why the so-called "dezinc" phenomenon is prevented in accordance with the present invention. Generally, the temperature and time schedule used during heat press lamination are preferably 160° C – 170° C and 1 hour respectively. Under these conditions formation of the desired ternary alloy from electrodepositted binary alloy is enhanced.

In the present invention, an alloy consisting of zinc and tin is first electrodepositted on the nodularized surface of copperfoil in an average thickness of 0.03 to 0.15 $\mu$, and this of layer of zinc-tin alloy diffuses completely into the surface portion of the nodularized copperfoil under the usual conditions of heat press lamination, and forms a thin layer of the desired ternary alloy consisting of copper-zinc-tin on the surface of the copper foil namely between copper-foil and resinous laminate, and the thus converted ternary alloy layer exhibit improved resistance to hydrochloric acid treatment.

In ordinary press lamination, copper foil and pre-preg are pressed under 18kg/cm$^2$ of pressure at 150° C or more, for 1 hour. In this case, if the electrodepositted binary alloy contains over 20% of tin, conversion to the desired ternary alloy does not occur, particularly if the tin content is below 3%, in which event the converted alloy does not show better resistance to hydrochloric acid than brass or bronze. Therefore the preferred range of tin content in electrodepositted binary alloy is between 20% and 3%. More preferably, binary alloy containing 15% - 3% of tin is employed since it exhibits yellowish appearance as brass after press lamination because the copper diffusion penetrates just to the surface of the binary alloy layer.

About the thickness of the electrodeposited binary alloy layer, depends on the kind of pre-preg a thickness of from, 0.03 $\mu$ - 0.15 $\mu$ is preferable. In the case that over 0.15 $\mu$ of binary alloy electrodeposited, conversion to ternary alloy is not carried out completely under the ordinary conditions of heat-press lamination. If the binary alloy layer is thinner than 0.03 $\mu$, too much copper is diffused into the binary layer and consequently the copper content in the ternary alloy exceeds the preferable range for the improved boundary layer, and results in poor resistance to acid treatment. A typical electrolytic bath composition according to the present invention giving preferable binary alloy electrodeposition is shown as follows:

Potassium pyrophosphate 300 g/l
Zinc pyrophosphate 40 g/l
Stannous pyrophosphate 1.5 g/l The above bath composition results in a 10% tin content in the binary alloy electrodepositted.

The tin content in the binary alloy layer can be controlled by changing the amount of stannous pyrophosphate in the bath composition, for instance, if the concentration of pyrophosphate is 0.5, 0.8, 2.3 and 3.0 g/l, the tin content of each electrodeposited binary alloy layer is 3, 5, 15 and 20%, respectively at bath conditions of pH 9.5, temperature 25° C, current density of 1 A/dm$^2$ and for 12 seconds electrodeposition.

To demonstrate the advantages of the present invention, the following experiments were conducted in which the barrier layer of the present invention is compared with such layers of the prior art in terms of the peel strength of etched laminates after hydrochloric acid treatment. The results of these experiments are shown in Table 1 hereinafter set forth.

In Table 1 a (kg/cm) is meant to indicate initial peel strength of copper clad laminate, and B(kg/cm) is meant to indicate peel strength after the immersion test in 20% hydrochloric acid at 25° C for 30 minutes. The reduction rate (C%) is a measure of resistance to hydrochloric acid calculated by the formula $C = (A-B) \times 100/A$), A and B being measured by instron autograph.

In these Experiments, the specimens were prepared as follows.

Each binary alloy which has the proportion of tin and zinc as shown in table 1 is electrodeposited under the conditions described above at a thickness of about 0.08 $\mu$, and the copperfoil thus treated was laminated with glass fiber reinforced with epoxy pre-preg under the following conditions pressure 18 kg/cm$^2$, at 150° C for 1 hour.

Conventional silk screen printing and etching were applied on these experimental copper clad laminates, using pattern sizes of 0.8 mm width and 50 mm long, to obtain strip specimens.

For comparative purposes the same copperfoils described above were subjected to electrodeposition of zinc from conventional zinc electroplating baths; brass from conventional cyanate zinc-copper baths, and tin from pyrophosphate baths respectively. These treated copper foils were also heat press laminated, printed and etched by the same procedure as described above. The thickness of these control samples were maintained at 0.08$\mu$ and 0.04$\mu$.

From table 1, it is evident that copper foil treated by the present invention exhibits a very low reducton of peel strength. Namely, it means that the boundary layer between copperfoil and laminated resinous layer has good resistance to hydrochloric acid. Consequently, copperfoil treated according to the presnt invention assures that adhesion and peel strength throughout all processing of printed circuit board even when immersed into etchant or hydrochloric acid solutions which have strong corrosive properties.

Also, the ternary alloy work as a barrier layer to copper migration trapping migrating copper as an alloy component, the surface after etching being clean and without stains or spotting. The ternary alloy layer formed from the binary alloy layer containing from 3% - 15% of tin after heat press lamination exhibits a yellowish brass like color. However, a ternary alloy formed from a binary alloy layer containing 20% tin exhibits an unacceptable tin-like gray color.

Table 1

| electro-deposit layer | thickness of electro-depositted alloy layer ($\mu$) | concentration of tin in zinc, tin alloy layer (%) | A Initial peel strength kg/cm | B peel strength after acid treatment kg/cm | C reduction rate % (A − B)/A × 100 |
|---|---|---|---|---|---|
| | 0.08 | 1 | 2.07 | 1.64 | 21 |
| | 0.08 | 3 | 2.20 | 1.96 | 11 |
| zinc and tin alloy | 0.08 | 5 | 2.15 | 2.00 | 7 |
| | 0.08 | 10 | 2.13 | 1.98 | 7 |
| | 0.08 | 15 | 2.18 | 2.05 | 6 |
| | 0.08 | 20 | 2.02 | 1.98 | 2 |
| zinc | 0.08 | | 2.05 | 1.56 | 24 |
| brass | 0.08 | | 2.05 | 1.56* | 24 |
| tin | 0.08 | | 2.08 | 1.63 ∫ 1.45* | 21 ∫ 30 |

Table 1-continued

| electro-deposit layer | thickness of electro-depositted alloy layer ($\mu$) | concentration of tin in zinc, tin alloy layer (%) | A Initial peel strength kg/cm | B peel strength after acid treatment kg/cm | C reduction rate % (A − B)/A × 100 |
|---|---|---|---|---|---|
| tin | 0.04 | | 2.20 | 1.65 ∫ 1.25 | 25 ∫ 43 |

*Unstable fractuated value would be recorded.

What I claim is:

1. A method for surface treatment of copper foil used for printed circuit boards comprising the steps of subjecting a nodularized surface of copper foil to electrodeposition thereon of a thin layer of zinc and tin alloy in which the tin content is from about 5 to 20%, and at a thickness of from $0.03\mu$ to $0.15\mu$, and adhering the alloy-covered surface of the nodularized copper foil thus obtained to a resinous laminate by heat and pressure until a layer of a ternary alloy of zinc, tin and copper is formed between said copper foil and said resinous laminate.

2. A method as claimed in claim 1, wherein the thickness of the layer of zinc and tin alloy is about $0.08\mu$.

3. A method as claimed in claim 1, wherein tin content of the thin layer of zinc and tin alloy is from 5 to 15%.

4. A method as claimed in claim 1, wherein the zinc and tin alloy surface deposited on the nodularized copper foil is adhered to the resinous laminate by maintaining the same for about 1 hour at a temperature of from 150° C to 170° C and pressure of from 15 to 20 kg/cm².

5. A method as claimed in claim 1 wherein a solution for electrodeposition of said zinc and tin alloy comprises potassium pyrophosphate, zinc pyrophosphate and tin pyrophosphate.

* * * * *